United States Patent
Han et al.

[11] Patent Number: 5,891,776
[45] Date of Patent: Apr. 6, 1999

[54] METHODS OF FORMING INSULATED-GATE SEMICONDUCTOR DEVICES USING SELF-ALIGNED TRENCH SIDEWALL DIFFUSION TECHNIQUES

[75] Inventors: Min-Koo Han; Chong-Man Yun; Yearn-Ik Choi, all of Seoul, Rep. of Korea

[73] Assignee: Samsung Electronics Co., Ltd., Suwon, Rep. of Korea

[21] Appl. No.: 645,804

[22] Filed: May 14, 1996

[30] Foreign Application Priority Data

May 22, 1995 [KR] Rep. of Korea .................. 1995/12803

[51] Int. Cl.$^6$ ................................... H01L 21/22
[52] U.S. Cl. ..................... 438/274; 438/302; 438/524; 438/555
[58] Field of Search ................... 438/274, 268, 438/273, 301, 302, 303, 305, 589, 524, 525, 555, 556

[56] References Cited

U.S. PATENT DOCUMENTS

| | | | |
|---|---|---|---|
| 4,419,811 | 12/1983 | Rice | 438/274 |
| 4,503,598 | 3/1985 | Vora et al. | 438/274 |
| 4,561,168 | 12/1985 | Pitzer et al. | 438/274 |
| 4,895,810 | 1/1990 | Meyer et al. | 438/274 |
| 4,960,723 | 10/1990 | Davies | 438/274 |
| 5,132,238 | 7/1992 | Murakami et al. | 438/274 |

OTHER PUBLICATIONS

T. Laska et al., *A Low Loss/Highly Rugged IGBT–Generation—Based On A Self Aligned Process With Double Implanted N/N$^+$–Emitter*, Proc. ISPSD, 1994, pp. 171–175.
B. Jayant Baliga et al., *The Insulated Gate Transistor: A New Three–Terminal MOS–Controlled Bipolar Power Device*, IEEE Trans. Electron Devices, vol. ED–31, pp. 821–828, Jun. 1984, pp. 192–199.
D.R. Disney et al., *SOI LIGBT Devices with a Dual P–Well Implant for Improved Latching Characteristics*, IEEE, 5th International Symposium on Power Semiconductor Devices and ICs, pp. 254–258, 1993.
Yo–Hwan Koh et al., *Latch–Back–Free Self–Aligned Power MOSFET Structure with Silicided Source and Body Contact*, IEEE Electron Device Letters, vol. 9, No. 8, Aug. 1988, pp. 408–410.

(List continued on next page.)

*Primary Examiner*—Michael Trinh
*Attorney, Agent, or Firm*—Myers Bigel Sibley & Sajovec

[57] ABSTRACT

A method of forming an insulated gate semiconductor device includes the steps of patterning an insulated gate electrode on a face of a substrate containing a first conductivity type region and forming a trench at the face using the gate electrode as a mask. Second conductivity type dopants are then deposited onto the bottom and sidewalls of the trench and diffused into the substrate to form a relatively lightly doped first body region. The gate electrode is then used again as a mask during a step of implanting a relatively high dose of second conductivity type dopants at the bottom of the trench. These implanted dopants are then partially diffused laterally and downwardly away from the bottom and sidewalls of the trench. The gate electrode is then used again to deposit first conductivity type dopants onto the sidewalls (and bottom) of the trench. The deposited first conductivity type dopants on the sidewalls and previously partially diffused second conductivity type dopants are then simultaneously diffused into the first body region. During this step, the deposited first conductivity type dopants diffuse laterally away from the sidewalls of trench and underneath the insulated gate electrode into the surrounding first body region to form source regions. The partially diffused second conductivity type dopants also continue to diffuse laterally away from the lowermost portions of the sidewalls of the trench and downward from the bottom of the trench to form a relatively wide second body region underneath the source region(s).

36 Claims, 8 Drawing Sheets

OTHER PUBLICATIONS

Byeong–Hoon Lee et al., *Latch–up Suppressed Insulated Gene Bipolar Transistor by the Deep $p^+$ Ion Implantation under the $n^+$ Source,* Jpn. J. Appl. Phys. vol. 33 (1994) pp. 563–566, Part 1, No. 1B, Jan. 1994.

B. Jayant Baliga, *Modern Power Devices,* Modern Power Devices, Chapter 7, Section 7.2, 1987, pp. 350–358.

STEP (a)

STEP (b)

STEP (c)

STEP (d)

STEP (e)

STEP (f)

STEP (g)

STEP (h)

STEP (i)

STEP (j)

STEP (k)

STEP (l)

STEP (m)

STEP (n)

STEP (o)

STEP (h)

STEP (i)

STEP (j)

STEP (k)

STEP (l)

STEP (m)

STEP (n)

STEP (o)

METHODS OF FORMING INSULATED-GATE SEMICONDUCTOR DEVICES USING SELF-ALIGNED TRENCH SIDEWALL DIFFUSION TECHNIQUES

FIELD OF THE INVENTION

The present invention relates to semiconductor devices, and more particularly to methods of forming insulated gate semiconductor devices and devices formed thereby.

BACKGROUND OF THE INVENTION

The silicon bipolar transistor has been the device of choice for many high power semiconductor device applications because bipolar transistors can be designed to handle relatively large current densities and support relatively high blocking voltages. However, despite the attractive power ratings achieved by bipolar transistors, there exist several fundamental drawbacks to their suitability for all high power applications. First of all, bipolar transistors are current controlled devices which require relatively large base currents, typically one fifth to one tenth of the collector current, to maintain the transistor in an operating mode. Proportionally larger base currents can be expected for applications which also require high speed turn-off. Because of the large base current demands, the base drive circuitry for controlling turn-on and turn-off is relatively complex and expensive. Bipolar transistors are also vulnerable to premature breakdown if a high current and high voltage are simultaneously applied to the device, as commonly required in inductive power circuit applications. Furthermore, it is relatively difficult to operate bipolar transistors in parallel because current diversion to a single transistor typically occurs at high temperatures, making emitter ballasting schemes necessary.

Insulated gate semiconductor devices, including the silicon power MOSFET, were developed, in part, to address this base drive problem. In a power MOSFET, the gate electrode provides turn-on and turn-off control upon the application of an appropriate gate bias. For example, turn-on in an N-type enhancement MOSFET occurs when a conductive N-type inversion layer is formed in the P-type body/channel region in response to the application of a positive gate bias. The inversion layer electrically connects the N-type source and drain regions and allows for majority carrier conduction therebetween. The power MOSFET's gate electrode is separated from the channel region by an intervening electrically insulating region comprising silicon dioxide (e.g., $SiO_2$). Because the gate is insulated from the channel region, little if any gate current is required to maintain the MOSFET in a conductive state or to switch the MOSFET from an on-state to an off-state or vice-versa. The gate current is kept small during switching because the gate forms a capacitor with the MOSFET's channel region. Thus, only charging and discharging current ("displacement current") is required during switching. Because of the high input impedance associated with the insulated gate electrode, minimal current demands are placed on the gate and the gate drive circuitry can be easily implemented. Moreover, because current conduction in the MOSFET occurs through majority carrier transport only, the delay associated with the recombination and storage of excess minority carriers is not present. Accordingly, the switching speed of power MOSFETs can be made orders of magnitude faster than that of bipolar transistors.

Unlike bipolar transistors, power MOSFETs can be designed to withstand high current densities and the application of high voltages for relatively long durations, without encountering the destructive failure mechanism known as "second breakdown". Power MOSFETs can also be easily paralleled, because the forward voltage drop of power MOSFETs increases with increasing temperature, thereby promoting an even current distribution in parallel connected devices. Other MOS-gated power devices such as thyristors and insulated gate bipolar transistors can also take advantage of the benefits achieved by using insulated gate electrodes for controlling turn-on and turn-off.

For example, in the insulated gate bipolar transistor (IGBT), disclosed in an article, entitled "The Insulated Gate Transistor: A New Three terminal MOS Controlled Bipolar Power Device," IEEE Trans. Electron Devices, ED-31, pp. 821–828 (1984), on-state losses were shown to be greatly reduced when compared to power MOSFETs. This performance advantage was achieved because of conductivity modulation of the IGBT's drift region during the on-state. The operation of the IGBT can be described as follows with respect to the cross-sectional representation and electrical schematic shown in FIGS. 1A and 1B, respectively. In the reverse bias region, the anode is biased negative with respect to the cathode and the lower junction (J3) is reverse biased, thereby preventing conduction from the cathode to anode even though the upper junction (J2) is forward biased. This provides the device with its reverse blocking capability. In its forward blocking state when the anode is biased positive with respect to the cathode and the gate and cathode are electrically connected, the upper junction (J2) is reversed biased and conduction is prevented. If, however, a positive gate bias of sufficient magnitude is applied to the gate, the P-body region under the gate becomes inverted and the device operates in its forward conducting mode. In this mode of operation, electrons flow from the $N^+$ source region into the N-drift region via the channel (inversion layer) under the gate. In addition, the lower junction (J3) is forward biased and the substrate $P^+$ region injects holes (minority carriers) into the N-drift region. As the forward bias increases, the injected hole concentration increases until it exceeds the background doping level of the N-drift region. This high level minority carrier injection causes a conductivity modulation in the N-drift region and significantly reduces the IGBT's on-resistance.

As long as the gate bias is sufficiently large to produce enough charge in the inversion layer, the IGBT forward conduction characteristics will resemble those of a P-i-N diode. If the inversion layer conductivity is low, however, a substantial voltage drop across the channel will occur. To switch the IGBT from its forward conducting mode of operation to its reverse blocking mode requires the removal of the positive gate bias to thereby cut off the supply of electrons from the $N^+$ source region to the N-drift region. Because of the high minority carrier concentration in the N-drift region, turn-off of the IGBT is not immediate, but instead is dependent on the minority carrier recombination lifetime in the N-drift region. Accordingly, the IGBT offers the potential for high forward conduction current density, full gate controlled transistor operation, low gate drive power requirements and reverse blocking capability providing directional power flow control.

One significant drawback to the operation of IGBTs at high current densities is the presence of the parasitic P-N-P-N structure between the anode and cathode which can cause a loss in the gate controlled turnoff capability. For example, as illustrated by FIG. 1B, the equivalent circuit for the IGBT of FIG. 1A includes a regenerative P-N-P-N path that can latch up if the lateral current in the P-body is sufficient to forward bias the P-body/N$^+$ source junction. As will be understood by one skilled in the art, latch-up can be prevented so long as the sum of the current gains of the regeneratively coupled P-N-P and N-P-N transistors ($\alpha_{pnp}$, $\alpha_{npn}$) is less than unity. The shorting resistance R$_p$ (i.e., R$_p$+R$_{p+}$) in FIG. 1B represents the short circuit resistance between the P-body and emitter (N$^+$ source) of the N-P-N transistor. The magnitude of R$_p$ is determined by the resistance of the P-body region underneath the N$^+$ source, as illustrated in FIG. 1A. Because the current gain of the N-P-N transistor ($\alpha_{npn}$) is directly dependent on the magnitude of R$_p$, a small R$_p$ has been deemed essential for latch-up free operation at high forward current densities. When the P-body sheet resistance is kept low and/or the width or doping of the N$^+$ source region is kept small, electron injection from the N$^+$ source region to the P-body can be suppressed because the uppermost P-N junction between the P-body and N$^+$ source is effectively short circuited, thereby eliminating the regenerative P-N-P-N path from between the anode and cathode. There are various processes that have been developed to reduce R$_p$, including those described in articles entitled "Latch-back-free Self-Aligned Power MOSFET Structure with Silicided Source and Body Contact", IEEE Elec. Dev. Lett., Vol. EDL-9, No. 8, pp. 408–410 (1988); "SOL LIGBT Devices with a Dual P Well Implant for Improved Latching Characteristics", Proc. ISPSD, pp. 254–258 (1993); and "Latch-up Suppressed Insulated Gate Bipolar Transistor by the Deep P Ion Implantation under the N Source", Jpn. Jour. Appl. Phys., Vol. 33, pp. 563–565, No. 1B, January (1994).

However, as described in an article by J. P Russell, A. M. Goodman, L. A. Goodman and J. M. Neilson, entitled "The COMFET-A New High Conductance MOS-Gated Device", IEEE Electron Device Letters, Vol. EDL-4, No. 3, March (1983), pp. 63–65, even devices having a relatively low R$_p$ can be susceptible to latch-up if sufficiently large forward current densities cause significant emitter injection into the base of the N-P-N transistor and cause $\alpha_{npn}$ to increase. To reduce the likelihood of parasitic latch-up, the COMFET structure was modified to include a heavily doped P$^+$ region in the middle of the P-body region, electrically connected to the cathode contact. To further lessen the magnitude of R$_p$, an aluminum contact was also provided for shorting the N$^+$ source regions to the P-body region.

FIG. 2 also illustrates a prior art IGBT embodying a trench which is formed after the lightly doped P-body and N$^+$ source regions have been formed by double-diffusion techniques. However, as illustrated, much of the N$^+$ source regions are still exposed to the relatively light doped body region which makes this device susceptible to parasitic thyristor latch-up. In addition, the N$^+$ source doping was made relatively high, thereby increasing emitter efficiency, and the diffusion process is relatively complicated in order to maintain the heavily doped P$^+$ region underneath the N$^+$ emitter without a shift in threshold voltage. This device is described in an article by Morikawa et al., entitled "US-DMOS: A Novel Structure for Power MOSFETs", Vol. J75-C-2, No. 2, Jour. of IEIC, pp. 85–91, February (1992).

Thus, notwithstanding these attempts to limit the susceptibility of insulated gate semiconductor devices to parasitic bipolar transistor turn-on, the presence of the N$^+$ source region in the P-body continues to pose a risk that under certain operating conditions parasitic bipolar transistor turn-on will occur and in the case of the IGBT cause parasitic thyristor latch-up. Furthermore, because many of the above described prior art IGBTs are not formed using self-alignment techniques and therefore require additional masking steps, the areas of the source region and body region may also be unnecessarily large to take into account photolithographic tolerances. This limits the degree to which these devices can be integrated as small unit cells for very high current applications.

SUMMARY OF THE INVENTION

It is therefore an object of the present invention to provide improved methods of forming insulated gate power semiconductor devices, and the devices formed thereby.

It is another object of the present invention to provide insulated gate power semiconductor devices which have reduced susceptibility to parasitic current conduction including parasitic thyristor latch-up and parasitic bipolar transistor turn-on, and methods of forming same.

It is another object of the present invention to provide insulated gate power semiconductor devices with small unit cell size, and methods of forming same.

It is still another object of the present invention to provide methods of forming insulated gate power semiconductor devices which allow a reduced number of critical photolithographic alignment and masking steps, and devices formed thereby.

It is a further object of the present invention to provide insulated gate power semiconductor devices which have low on-state resistance and low forward voltage drop, and methods of forming same.

These and other objects, features and advantages of the present invention are provided by a method which combines a unique series of DMOS and trench semiconductor processing techniques to simultaneously reduce the size and lateral resistance of the body region and source regions of an insulated gate semiconductor device and reduce the number of critical photolithographic alignment and masking steps required to form these regions. According to a preferred embodiment of the present invention, a patterned insulated gate electrode is used as a mask to define a self-aligned source region of first conductivity type and body region of second conductivity type in insulated gate power semiconductor devices such as MOSFETs, IGBTs and insulated gate thyristors. In this embodiment, an insulated gate electrode is first formed on a face of a semiconductor substrate and then patterned to expose a portion(s) of the face where the body region (or base region) and source regions are to be formed. Preferably, a trench is then formed in the exposed substrate using the insulated gate electrode as a mask and then second conductivity type dopants (e.g., P-type) are deposited onto the bottom and sidewalls of the trench and then diffused into the substrate to form a relatively lightly doped first body region of second conductivity type.

The insulated gate electrode is then used a second time as a mask during a step of implanting a relatively high dose of second conductivity type dopants at the bottom of the trench. These implanted dopants are then partially diffused laterally and downwardly away from the bottom of the trench so that a more highly doped second body region can be formed in the first body region, adjacent the bottom of the trench. The insulated gate electrode is then used a third time as a mask to deposit first conductivity type dopants (e.g., N-type) onto the sidewalls (and bottom) of the trench. This sidewall deposition step is followed by the step of simultaneously diffusing the deposited first conductivity type dopants on the sidewalls and previously partially diffused second conductivity type dopants into the first body region. During this step, the deposited first conductivity type dopants diffuse laterally away from the sidewalls of trench and underneath the insulated gate electrode into the surrounding first body region to form a single source region, such as an annular source region, or pair of source regions, such as a pair of parallel stripe-shaped source regions. These source regions also define channel regions, within the first body region, which extend underneath the insulated gate electrode, at the face of the substrate. The partially diffused second conductivity type dopants also continue to diffuse laterally away from the lowermost portions of the sidewalls of the trench and downward from the bottom of the trench to form a relatively wide second body region underneath the source region(s). In particular, by partially diffusing the implanted second conductivity type dopants first and then simultaneously diffusing both the first and second conductivity type dopants to form the source and second body regions, the maximum lateral distance between the lower sidewalls of the trench and the non-rectifying junction (e.g., P+/P) between the second and first body regions is preferably maintained at greater than (or at least equal to) the maximum lateral distance between the upper sidewalls of the trench and the P-N rectifying junction formed by the source and first body regions. Similarly, for the case of a square, circular or hexagonal trench, the lateral outer periphery of the annular source region is preferably less than or equal to the lateral outer periphery of the second body region.

These above steps can be used to form source region(s) of carefully controlled length, thickness and doping and body regions having very low resistance in the areas extending laterally beneath the source regions. This limits the likelihood of turn-on of the P-N junctions formed by the source regions and the second body region (and first body region) and therefore limits the likelihood of parasitic thyristor latch-up in IGBTs and thyristors or parasitic bipolar transistor turn-on in MOSFETs. Also, by eliminating the necessary photolithographic tolerances associated with methods requiring repeated critical masking steps, the lateral dimension of the first body region, which determines the unit cell size, can be made relatively small so that parallel cells can be highly integrated for high current applications and low on-state resistance and low forward voltage drop can be achieved.

DESCRIPTION OF PREFERRED EMBODIMENTS

Figure 1B:
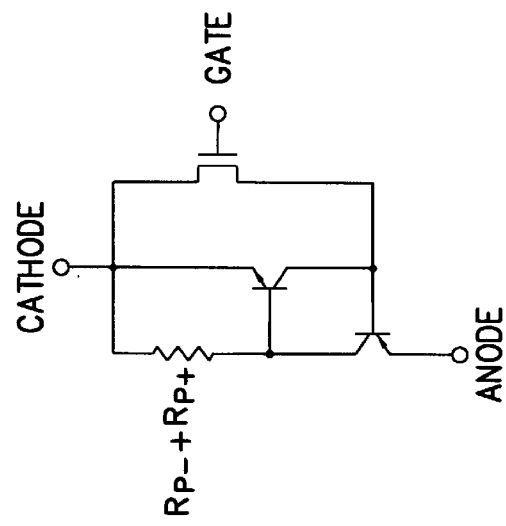
FIG. 1B illustrates an equivalent electrical schematic of the insulated gate bipolar transistor of FIG. 1A.
Figure 1A:
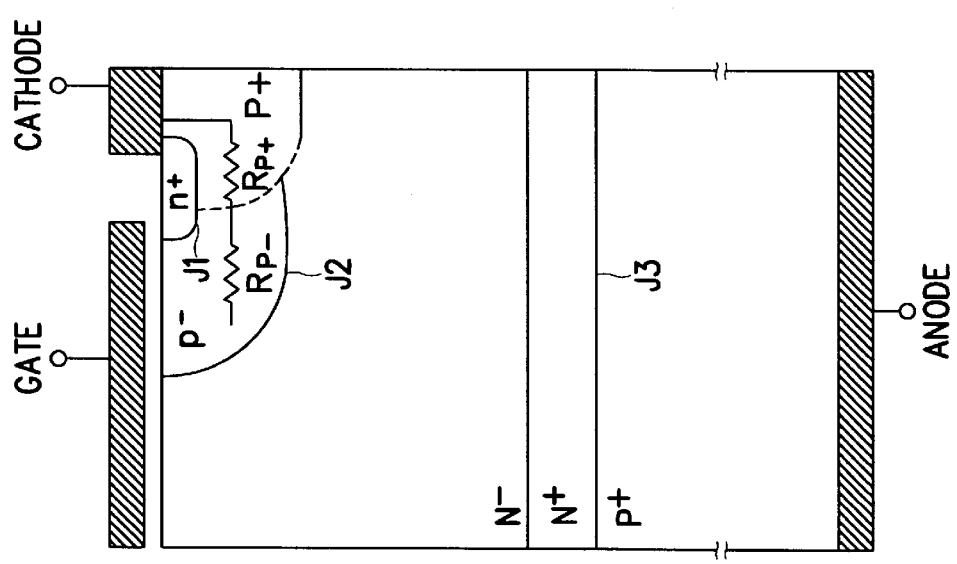
FIG. 1A illustrates a cross-sectional representation of a prior art insulated gate bipolar transistor.
Figure 2:
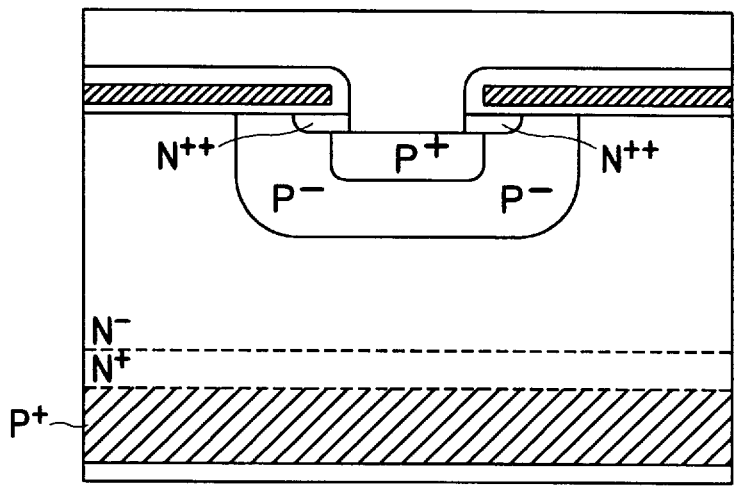
FIG. 2 illustrates a cross-sectional representation of another prior art insulated gate bipolar transistor.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as N or P-type, however, each embodiment described and illustrated herein includes its complementary embodiment as well.

Figure 3A:
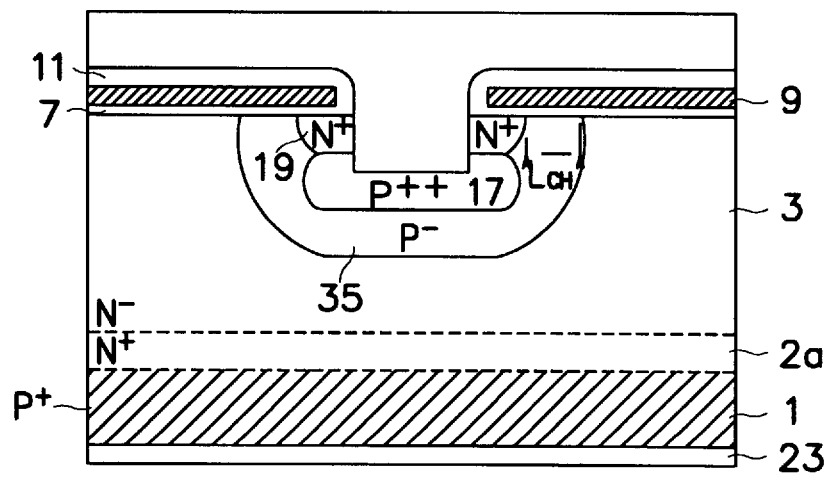
FIG. 3A illustrates a cross-sectional representation of a insulated gate bipolar transistor according to a preferred embodiment of the present invention.
Figure 3B:
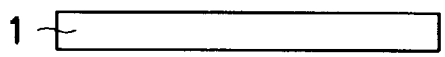
FIGS. 3B–3C include schematic cross-sectional views of intermediate structures illustrating a method, steps (a)–(o), of forming a vertical insulated gate semiconductor device according to a first embodiment of the present invention.
Figure 3B:
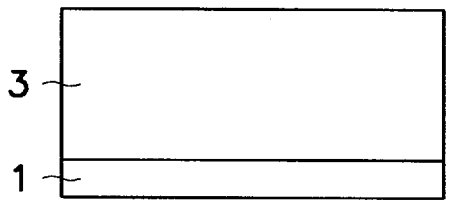
Figure 3B:
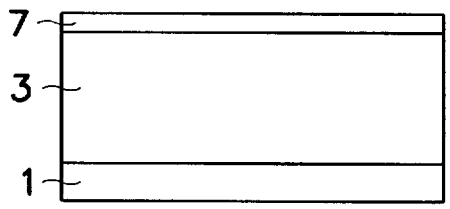
Figure 3B:
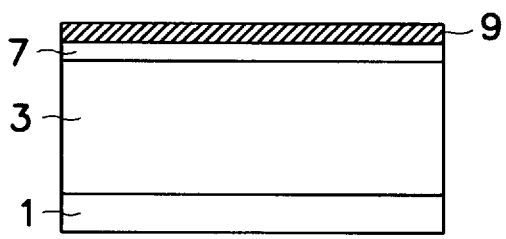
Figure 3B:
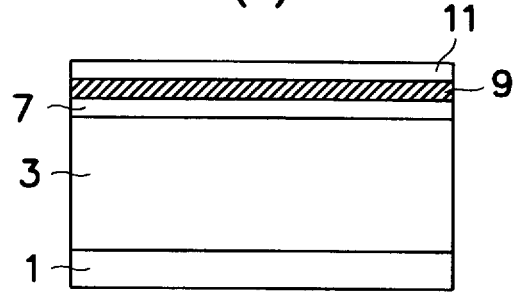
Figure 3B:
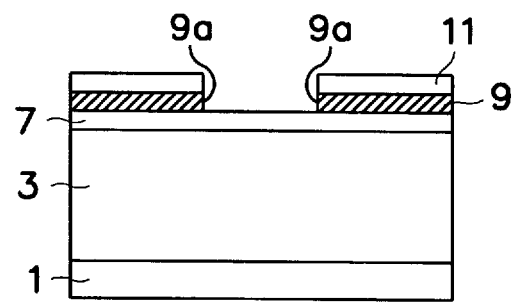
Figure 3B:
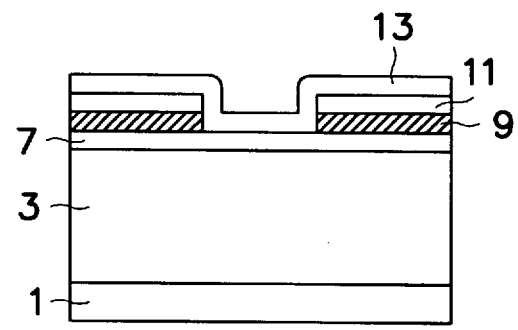
Figure 3C:
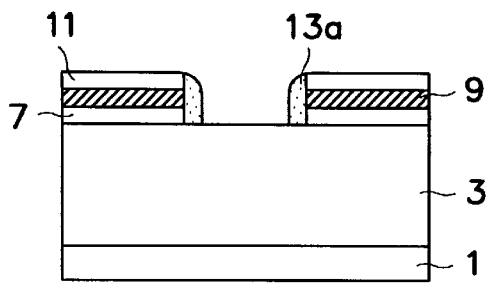
Figure 3C:
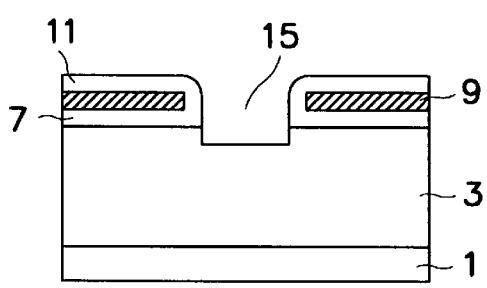
Figure 3C:
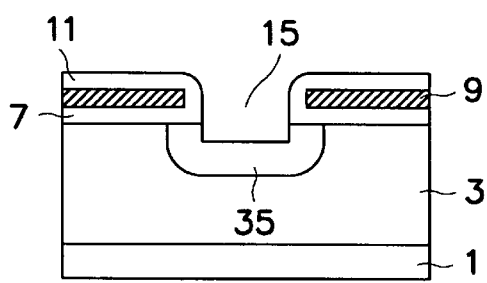
Figure 3C:
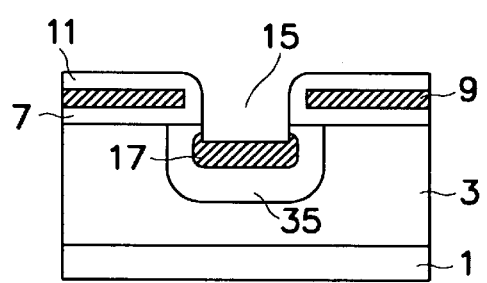
Figure 3C:
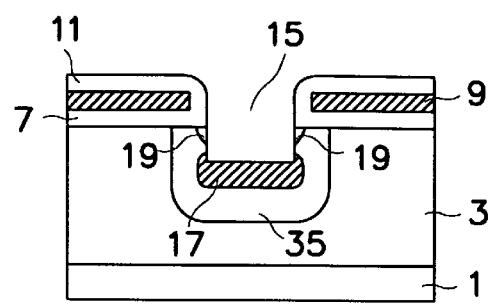
Figure 3C:
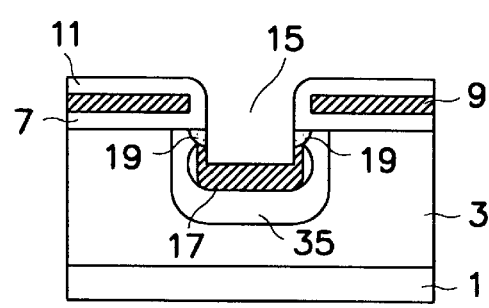
Figure 3C:
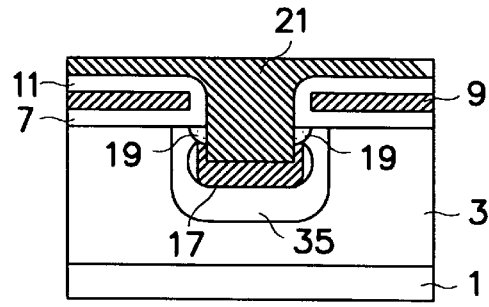
Figure 3C:
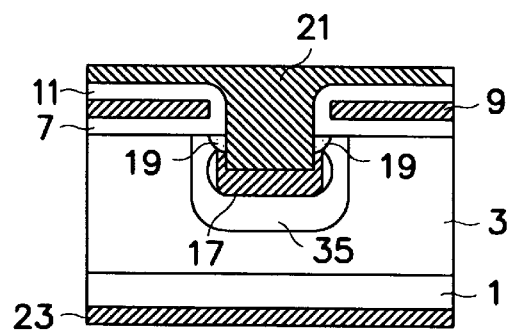

Referring now to FIGS. 3A–3C, a cross-sectional illustration of an insulated gate semiconductor device unit cell according to one embodiment of the present invention and intermediate structures illustrating a preferred method of forming the illustrated semiconductor device of FIG. 3A, will be described. In particular, FIGS. 3B–3C illustrate the steps (a)–(o) of forming a vertical insulated gate semiconductor device, such as a vertical insulated gate bipolar transistor (IGBT). The illustrated semiconductor device has, among other things, reduced susceptibility to parasitic thyristor latch-up, small unit cell size, low on-state resistance and low forward voltage drop, relative to conventional power devices. The illustrated device forming steps (a)–(o) also require a reduced number of critical photolithographic alignment and masking steps, relative to conventional power devices, as more fully described hereinbelow.

Referring specifically now to FIGS. 3B–3C, step (a), a semiconductor layer 1 of second conductivity type (e.g., P+) is initially provided. This layer forms the anode region (emitter) in the device of FIG. 3A. In step (b), a relatively lightly doped layer 3 of first conductivity type (e.g., N−) is formed on the P-type layer 1, preferably using epitaxial growth techniques which are well known to those skilled in the art. The N-type layer 3 ultimately forms the drift region in the device of FIG. 3A. Alternatively, the P-type layer 1 may be formed by implanting and/or depositing and diffusing second conductivity type dopants into the bottom of the N-type layer 3. The device of FIG. 3A also illustrates a relatively highly doped buffer layer 2a of first conductivity type (e.g., N+) disposed between the P-type anode region 1 and N-type drift region 3. Accordingly, prior to epitaxially forming the relatively lightly doped N-type drift region 3 in step (b) of FIG. 3B, an N-type buffer layer 2a may be formed on the P-type anode region 1 using similar epitaxial growth techniques and in-situ doping techniques. In step (c), a gate electrode insulating region 7 is formed on a top face of a semiconductor substrate containing the lightly doped drift region 3 and anode region 1 therein. This gate electrode insulating region 7 is preferably formed by growing an approximately 1000 Å thick oxide (e.g., $SiO_2$) on the lightly doped drift region 3. The step of forming a gate electrode insulating region 7 is then followed by a step of forming a gate electrode region 9 on the gate electrode insulating region 7, opposite the top face of the semiconductor substrate. This step is illustrated as step (d) and preferably includes depositing a polycrystalline silicon layer on the gate electrode insulating region 7 and then performing a $POCL_3$ doping step to lower the resistance of the polycrystalline silicon layer.

These steps can then be followed by the step of forming a first electrically insulating film 11, such as silicon nitride ($Si_3N_4$), on the gate electrode region 9, step (e). This film 11 facilitates the performance of a noncritical photolithographic alignment and masking step which is then followed by anisotropic etching of the film 11 using reactive ion etching (RIE). In particular, reactive ion etching of the gate electrode region is performed, step (f), to define exposed gate electrode layer sidewalls 9a. A second electrically insulating film 13, such as silicon nitride, is then formed on the exposed gate electrode layer sidewalls 9a, step (g). Sidewall spacers 13a are then formed by anisotropically etching the second electrically insulating film 13, step (h). The portion of the gate electrode insulating region 7 defined by the sidewalls spacers 13a is also removed to expose the top face of the substrate. As illustrated by step (i), the first electrically insulating film 11 and sidewall spacers 13a (e.g., $Si_3N_4$) are then used as a mask during the step of forming a trench 15, by performing self-aligned anisotropic etching of the lightly doped drift region 3.

Referring now to step (j), the formation of a relatively lightly doped first body region 35 of second conductivity type is achieved by depositing a second conductivity type dopant into the trench 15 and then diffusing (e.g., driving-in) the second conductivity type dopant into the drift region 3. Preferably, this step includes the steps of predepositing boron at a temperature of 900° C. for about 70 minutes and then performing drive-in at 1150° C. for 500 minutes. As will be understood by those skilled in the art, the diffusion of the second conductivity type dopant occurs laterally away from the sidewalls of the trench 15 and vertically downward into the drift region 3 to form a P-type well 35 which extends to the top face of the substrate. The above described steps (i) and (j) may also be reversed so that deposition and diffusion of the second conductivity type dopant occurs at the face of the substrate, before the trench 15 is formed therein, although this sequence is less preferred.

As illustrated by step (k), a dopant of second conductivity type is then implanted at the bottom of the trench 15 with very limited exposure to the sidewalls of the trench because of the near vertical (e.g., 90°) angle of incidence of the implanted ions. Preferably, this step is performed by implanting boron ions at an energy of about 20 KeV and a dose in the range of about $1 \times 10^{15} - 1 \times 10^{16}$ cm$^{-2}$ to form a high concentration of second conductivity type dopants at the bottom the trench 15. This high concentration of implanted second conductivity type dopants is then diffused into the first body region 35 to form a highly doped second body region 17. This diffusion step preferably occurs at a temperature of about 1100° C. for 500 minutes. After partial drive-in of the second body region dopants, first conductivity type dopants (e.g., phosphorus) are deposited in the trench 15 at a temperature of about 900° C. for 20 minutes to initiate formation of the source regions 19 at the sidewalls of the trench 15, step (I). Depending on the shape of the trench (e.g., stripe, circular or rectangular), the source regions 19, which appear as a pair of regions when viewed in transverse cross-section, may be a singular source region of annular shape or a pair of parallel source regions, for example. As will be understood by those skilled in the art, the concentration of the deposited first conductivity type dopants is preferably selected at low enough levels to prevent any significant compensation of the second body region 17. Moreover, by forming the source regions 19 after initiation of formation of the second body region 17, lower doping concentrations in the source regions 19 can be utilized to limit emitter efficiency.

As illustrated by step (m), the source regions 19 are driven-in laterally from the sidewalls of the trench 15 and simultaneously therewith, the second conductivity type dopants in the second body region 17 are driven-in to their full and final depth and width underneath the source regions 19. Thus, these regions have doping profile gradients (e.g., guassian profile) extending in the lateral direction. This step is preferably performed at a temperature of about 1050° C. for 90–150 minutes. Preferably, the initial and final drive-in times and temperatures for the second conductivity type dopants in the second body region 17 are selected to obtain the appropriate channel length ($L_{CH}$) in the first body region 35; and so that the lateral extension of the second body region is about equal to the length of the source regions, as measured from the sidewalls of the trench 15. This minimizes the effective body resistance ($R_p$) underneath the source regions 19 and thereby inhibits turn-on of a parasitic bipolar transistor formed by the drift, body and source regions. Lower emitter efficiency in the source regions 19 also inhibits turn-on of the parasitic bipolar transistor.

As will be understood by those skilled in the art, preventing turn-on of the bipolar transistor formed by the drift, body and source regions also inhibits parasitic latch-up of the regeneratively coupled N-P-N and P-N-P bipolar transistors formed by the anode, drift, body and source regions. These drive-in times and temperatures can also preferably take into account the different diffusion coefficients of the selected first and second conductivity type dopants to insure an adequate lateral extension of the second body region. Accordingly, because the respective drive-in steps for the source and second body regions are performed substantially simultaneously, the area underneath the source regions 19 will be occupied by the highly doped second body region 17, but the area separating the source regions 19 from the drift region 3 at the face of the substrate (i.e., the channel region) will always be occupied by the relatively lightly doped first body region 35 to preserve low turn-on voltage (i.e., threshold voltage ($V_{th}$)). In particular, the above described preferred steps can cause the maximum lateral distance between the lower sidewalls of the trench 15 and the non-rectifying junction (e.g., P+/P) between the second and first body regions to be greater than (or at least equal to) the maximum lateral distance between the upper sidewalls of the trench 15 (near the face) and the P-N rectifying junction formed by the source and first body regions. Similarly, for the case of a square, circular or hexagonal trench 15, the lateral outer periphery of the annular source region 19 can be maintained at less than or equal to the lateral outer periphery of the second body region 17.

The source and second body region diffusion steps are then followed by the steps of forming the cathode electrode 21, anode electrode 23 and gate electrode contact (not shown). In particular, as illustrated by step (n), an etching step is performed to open a gate electrode contact window in a third dimension (not shown) and then metallization is evaporated (e.g., aluminum) into the trench 15 and gate contact window and driven-in to form ohmic contacts to the gate electrode 9, source regions 19 and second body region 17. The metallization is then etched and annealed. Referring now to step (o), metallization of the bottom face is performed by evaporating aluminum to form an anode electrode 23 in ohmic contact with the P-type anode region 1.

Figure 3D:
FIGS. 3D–3E include schematic cross-sectional views of intermediate structures illustrating a method, steps (a)–(o), of forming a lateral insulated gate semiconductor device according to a second embodiment of the present invention.
Figure 3D:
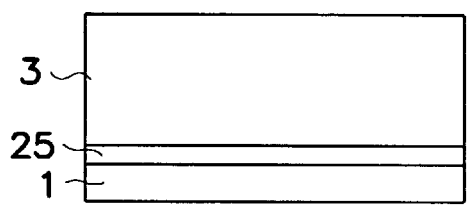
Figure 3D:
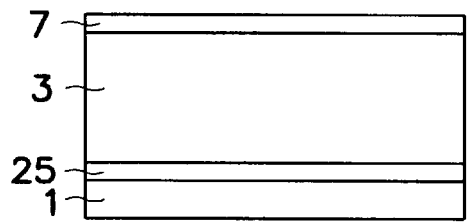
Figure 3D:
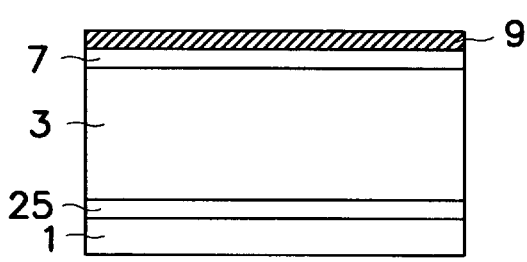
Figure 3D:
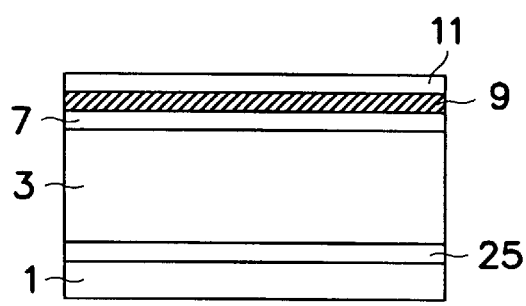
Figure 3D:
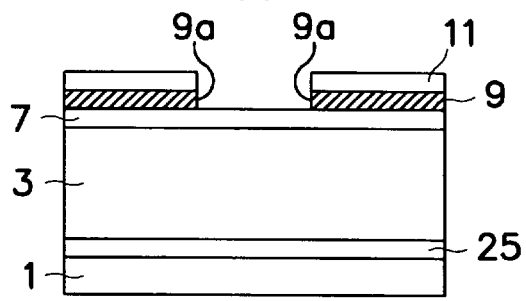
Figure 3D:
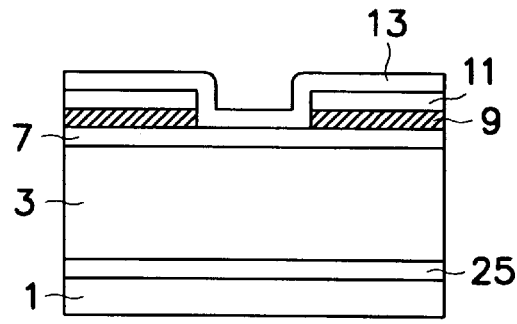
Figure 3E:
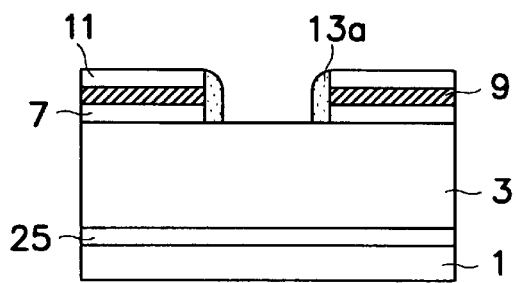
Figure 3E:
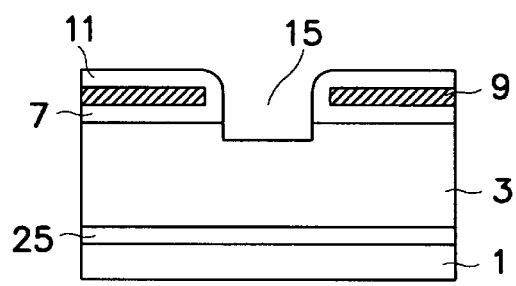
Figure 3E:
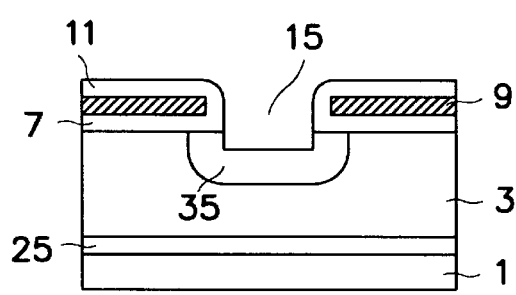
Figure 3E:
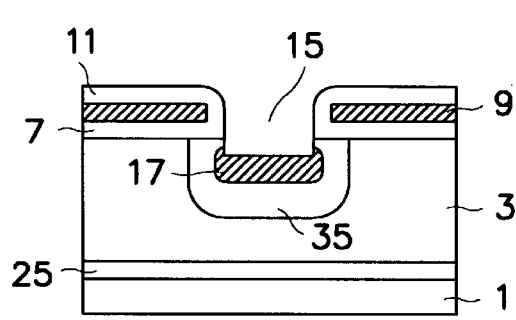
Figure 3E:
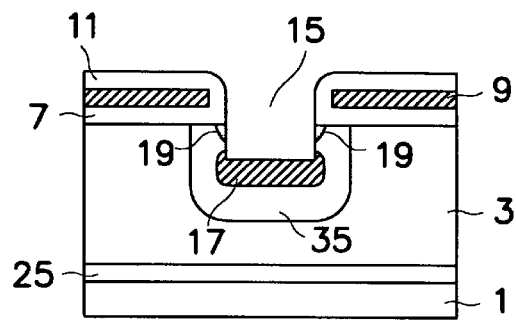
Figure 3E:
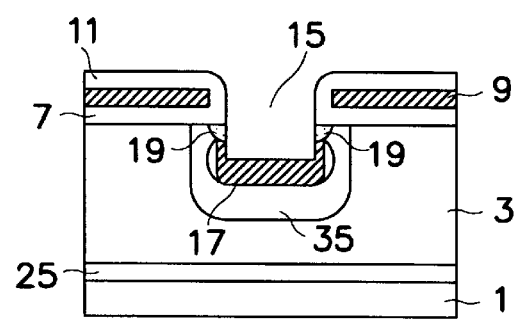
Figure 3E:
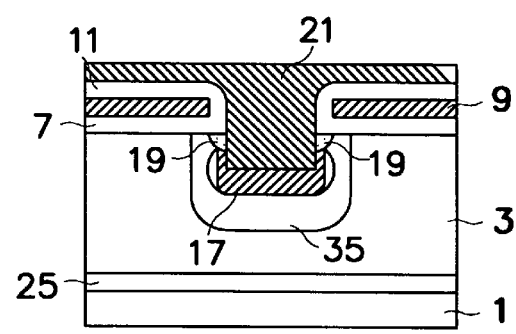
Figure 3E:
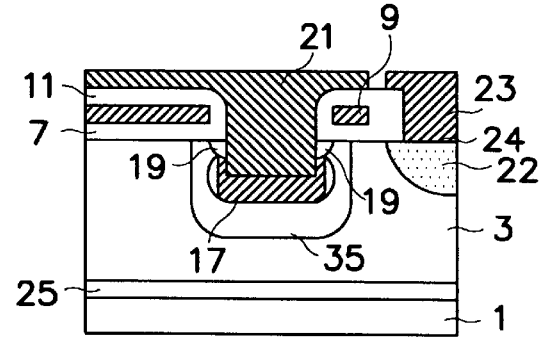

Referring now to FIGS. 3D–3E, steps (a)–(o), a method of forming a lateral insulated gate semiconductor device according to the present invention will be described. In particular, steps (b)–(n) of FIGS. 3D–3E are similar to the above described steps (b)–(n) of FIGS. 3B–3C and will not be further described herein. However, step (a) of FIG. 3D illustrates an additional step of preparing the semiconductor layer 1 of second conductivity type (e.g., P+) by forming an electrically insulating layer 25 (e.g., $SiO_2$) thereon. Accordingly, the subsequently formed relatively lightly doped layer 3 of first conductivity type (e.g., N−) will be electrically isolated from the underlying semiconductor layer 1. Thus, the substrate, which include the insulating layer 25 and the lightly doped layer 3, comprises an SOI substrate which is suitable for the formation of lateral devices. Referring now to step (o), final processing of the lateral insulated gate semiconductor device includes etching the electrically insulating film 11, the gate electrode layer 9 and the gate electrode insulating region 7 at the top face, at a position laterally separated from the first body region 35, as illustrated. Second conductivity type dopants are then deposited at the top face and diffused into the drift region 3 to form a P-type anode region 22 and then anode metallization is applied to form the anode electrode 23 and complete the lateral device.

Accordingly, the present invention combines a unique series of steps to simultaneously reduce the size and lateral resistance of the body and source regions of an insulated gate semiconductor device and reduce the number of critical photolithographic alignment and masking steps required to form these regions. In particular, these above steps can be used to form source region(s) of carefully controlled length, thickness and doping and body regions having very low resistance in the areas extending laterally beneath the source regions. This limits the likelihood of turn-on of the P-N junctions formed by the source regions and the second body region (and first body region) and therefore limits the likelihood of parasitic thyristor latch-up in IGBTs and thyristors or parasitic bipolar transistor turn-on in MOSFETs. Also, by eliminating the necessary photolithographic tolerances associated with methods requiring repeated critical masking steps, the lateral dimension of the first body region, which determines the unit cell size, can be made relatively small so that parallel cells can be highly integrated for high current applications and low on-state resistance and low forward voltage drop can be achieved.

Figure 4:
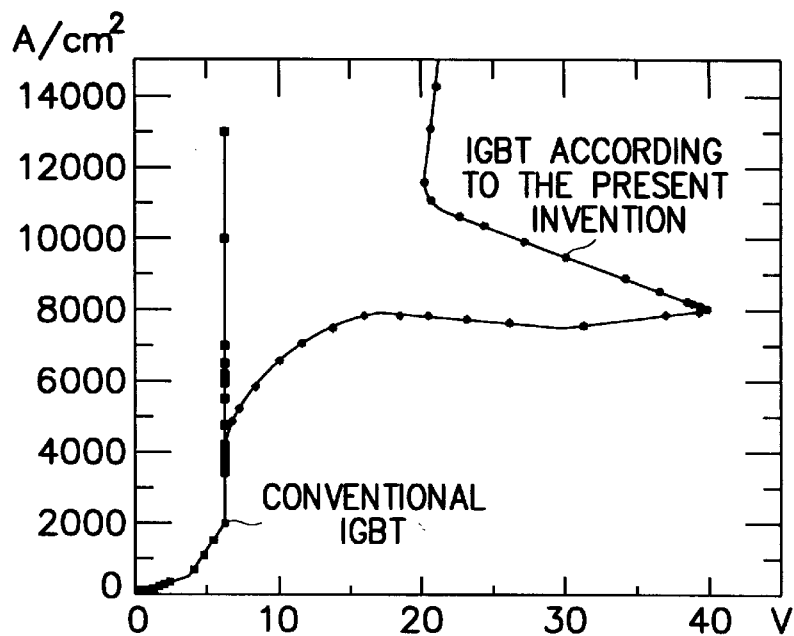
FIG. 4 is a graph containing I–V curves simulating forward current density versus terminal voltage for a conventional insulated gate bipolar transistor and an insulated gate bipolar transistor according to the present invention.

Referring now to FIG. 4, a graph containing I–V curves simulating forward current density versus terminal voltage for a conventional insulated gate bipolar transistor and an insulated gate bipolar transistor (IGBT) having a second body region implant dose of $5 \times 10^{15}$ cm$^{-2}$ according to the present invention, is illustrated. The graph shows that latch-up in the IGBT according to the present invention occurs at a density of about 9000 A/cm$^2$ which is a greater than four (4) times improvement over the 2000 A/cm$^2$ latch-up current density of a conventional IGBT.

Figure 5:
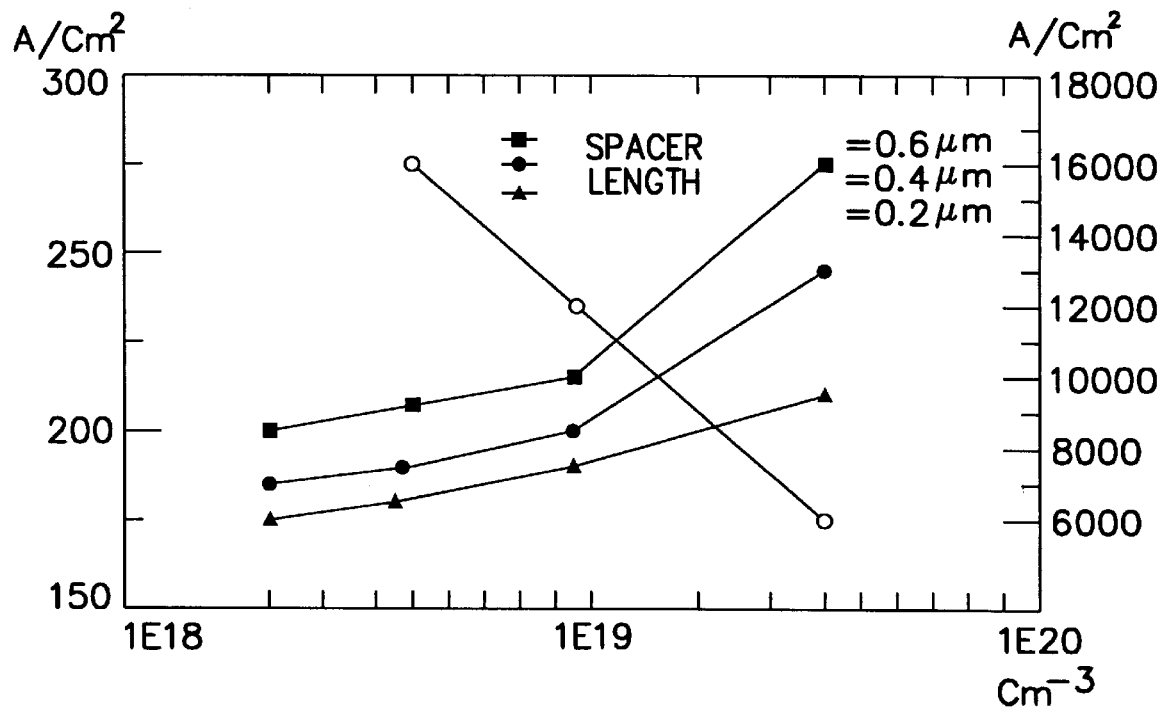
FIG. 5 is a graph containing curves simulating latch-up and forward current densities versus peak source doping concentration, at gate spacer lengths of 0.2, 0.4 and 0.6 µm, for an insulated gate bipolar transistor according to the present invention.

FIG. 5 is also a graph containing curves simulating latch-up and forward current densities versus peak source doping concentration, at gate spacer lengths of 0.2, 0.4 and 0.6 $\mu$m and forward voltage drop of 2 V, for an insulated gate bipolar transistor according to the present invention. The spacer lengths are determined by the thickness of the deposited silicon nitride ($Si_3N_4$) layer and etching conditions. The concentration of the phosphorus ion for the source region, which is deposited into the trench, is also fixed at a constant value of $5 \times 10^{15}$ cm$^{-2}$. As illustrated, the latch-up current density is 6000 A/cm$^{-2}$ when the phosphorus concentration in the source region is $4 \times 10^{19}$ cm$^{-3}$ and increases as the phosphorus concentration decreases. Latch-up also does not occur for phosphorus doping concentrations in the source below $5 \times 10^{18}$ cm$^{-3}$, which can be explained by a decrease in the emitter efficiency of the parasitic bipolar transistor (e.g., NPN) caused by the low source concentration and decrease in the length of the emitter.

Figure 6:
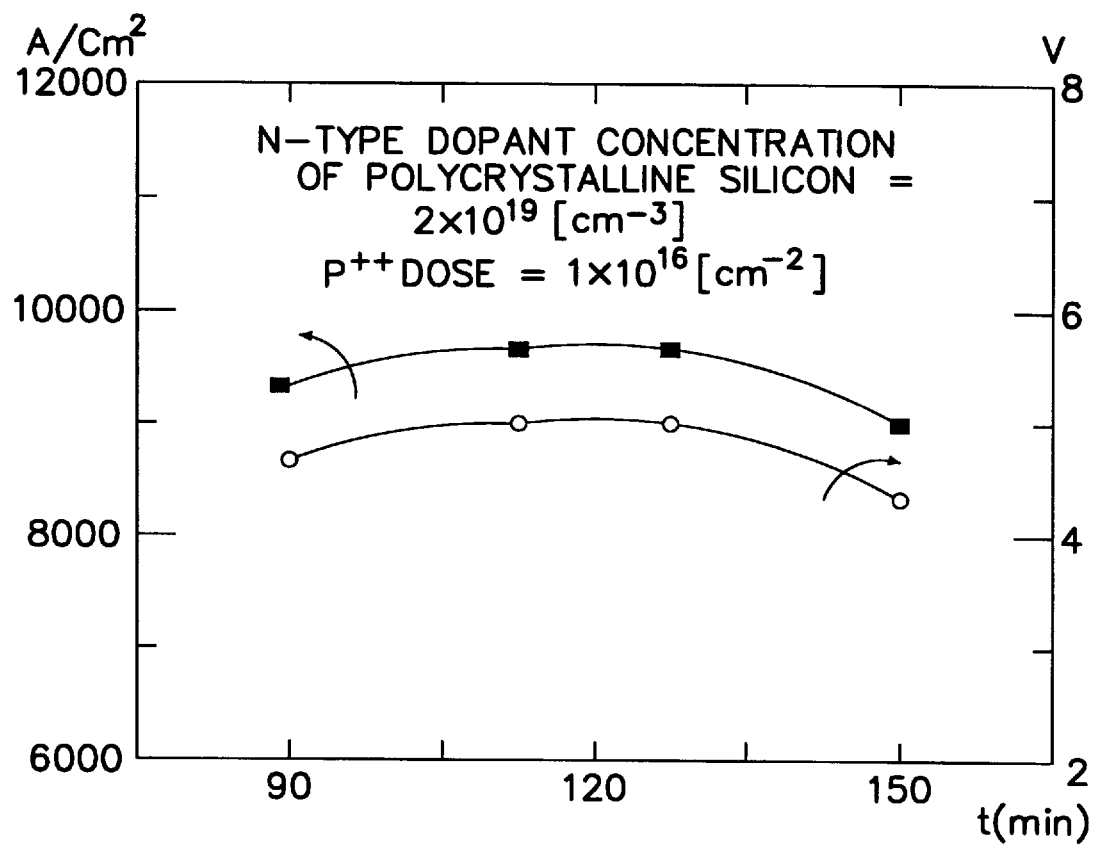
FIG. 6 is a graph containing curves simulating threshold voltage and latch-up current density versus source diffusion time, for an insulated gate bipolar transistor according to the present invention.

Finally, FIG. 6 is a graph containing curves simulating threshold voltage and latch-up current density versus source diffusion time (at 1150° C.), for an insulated gate bipolar transistor according to the present invention. The curves of FIG. 6 are based on a boron implant dose for the second body region of $5 \times 10^{18}$ cm$^{-2}$ and a surface peak concentration in the source region of $2 \times 10^{19}$ cm$^{-3}$. As the diffusion time varies from 90 minutes to 150 minutes, the threshold voltage and latch-up current density vary from 4.4 V to 4.1 V and 9000 A/cm$^2$ to 9800 A/cm$^2$, respectively. The weak relationship between diffusion time and latch-up current density can be explained by the fact that the source and second body regions are diffused simultaneously so that the whole area under the source region is occupied by the second body region of low resistance and the channel region at the face is not significantly influenced by second body region diffusion.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an insulated gate semiconductor device, comprising the steps of:

forming a gate electrode on a face of a semiconductor substrate containing a region of first conductivity type therein;

forming a trench having a bottom and sidewalls in the semiconductor substrate, by etching the region of first conductivity type using the gate electrode as an etching mask;

forming a first body region of second conductivity type in the region of first conductivity type; and after said trench forming step:

forming a second body region of second conductivity type in the semiconductor substrate by diffusing dopants from adjacent the bottom of the trench into the first body region so that the second body region has a higher second conductivity type dopant concentration therein than the first body region; and then forming a source region of first conductivity type in the semiconductor substrate by diffusing dopants from adjacent the sidewalls of the trench into the first and second body regions so that the source region forms rectifying junctions with both the first and second body regions.

2. The method of claim 1, wherein said step of forming a first body region comprises forming a first body region which is self-aligned to the gate electrode.

3. The method of claim 2, wherein said trench forming step precedes said first body region forming step.

4. The method of claim 2, wherein said trench forming step follows said first body region forming step.

5. The method of claim 1, wherein said trench and gate electrode forming steps comprise:

forming a gate electrode insulating region on the face of the semiconductor substrate;

forming a gate electrode on the gate insulating region, opposite the face of the semiconductor substrate;

removing a portion of the gate electrode insulating region to expose the face of the semiconductor substrate; and etching the exposed face of the semiconductor substrate to define a trench which is self-aligned to the gate electrode.

6. The method of claim 5, wherein said first body region forming step comprises diffusing dopants of second conductivity type from the bottom and sidewalls of the trench into the region of first conductivity type so that the first body region extends adjacent the face of the semiconductor substrate and opposite the gate electrode.

7. The method of claim 5, wherein said first body region forming step comprises diffusing dopants of second conductivity type from adjacent the exposed face of the semiconductor substrate into the region of first conductivity type.

8. The method of claim 5, wherein said step of removing a portion of the gate electrode insulating region is preceded by the step of forming sidewall spacers on sidewalls of the gate electrode; and wherein the trench and first body region are both self-aligned to the sidewall spacers.

9. A method of forming an insulated gate semiconductor device, comprising the steps of:

forming a gate electrode insulating layer on a face of a semiconductor substrate containing a region of first conductivity type therein;

forming a gate electrode layer on the gate electrode insulating layer;

forming a first electrically insulating layer on the gate electrode layer;

removing a portion of the first electrically insulating layer and a corresponding underlying portion of the gate electrode layer to define a gate electrode having sidewalls;

forming sidewall spacers on the exposed gate electrode sidewalls;

forming a trench having a bottom and sidewalls which are self-aligned to the sidewall spacers, in the semiconductor substrate;

forming a first body region of second conductivity type which is self-aligned to the sidewall spacers, in the region of first conductivity type; and after said trench forming step:

forming a second body region of second conductivity type in the semiconductor substrate by diffusing dopants from adjacent the bottom of the trench into the first body region so that the second body region has a higher second conductivity type dopant concentration therein than the first body region; and then forming a source region of first conductivity type in the semiconductor substrate by diffusing dopants from adjacent the sidewalls of the trench into the first and second body regions so that the source region forms rectifying junctions with both the first and second body regions.

10. The method of claim 9, wherein said first body region forming step comprises diffusing dopants of second conductivity type from adjacent the face of the semiconductor substrate into the region of first conductivity type.

11. The method of claim 9, wherein said first body region forming step comprises depositing dopants of second conductivity type adjacent the bottom and sidewalls of the trench and then diffusing the deposited dopants of second conductivity type into the region of first conductivity type.

12. The method of claim 9, wherein said second body region forming step comprises the steps of implanting dopants of second conductivity type at the bottom of the trench and then diffusing the implanted dopants of second conductivity type into the first body region.

13. The method of claim 12, wherein said source region forming step follows said second body region forming step and comprises depositing dopants of first conductivity type on the sidewalls of the trench and then simultaneously diffusing the deposited dopants of first conductivity type and the implanted dopants of second conductivity type into the first body region.

14. The method of claim 10, wherein said second body region forming step comprises the steps of implanting dopants of second conductivity type at the bottom of the trench and then diffusing the implanted dopants of second conductivity type into the first body region.

15. The method of claim 14, wherein said source region forming step follows said second body region forming step and comprises depositing dopants of first conductivity type on the sidewalls of the trench and then simultaneously diffusing the deposited dopants of first conductivity type and the implanted dopants of second conductivity type into the first body region.

16. The method of claim 11, wherein said second body region forming step comprises the steps of implanting dopants of second conductivity type at the bottom of the trench and then diffusing the implanted dopants of second conductivity type into the first body region.

17. The method of claim 16, wherein said source region forming step follows said second body region forming step and comprises depositing dopants of first conductivity type on the sidewalls of the trench and then simultaneously diffusing the deposited dopants of first conductivity type and the implanted dopants of second conductivity type into the first body region.

18. The method of claim 9, wherein said step of forming sidewall spacers comprises the steps of forming a second electrically insulating layer on the gate electrode sidewalls and then anisotropically etching the second electrically insulating layer and the gate electrode insulating layer to expose the face of the semiconductor substrate.

19. The method of claim 18, wherein said first body region forming step precedes said trench forming step and comprises diffusing dopants of second conductivity type from adjacent the face of the semiconductor substrate into the region of first conductivity type.

20. The method of claim 18, wherein said first body region forming step comprises depositing dopants of second conductivity type adjacent the bottom and sidewalls of the trench and then diffusing the deposited dopants of second conductivity type into the region of first conductivity type.

21. The method of claim 18, wherein said second body region forming step comprises the steps of implanting dopants of second conductivity type at the bottom of the trench and then diffusing the implanted dopants of second conductivity type into the first body region.

22. The method of claim 21, wherein said source region forming step follows said second body region forming step and comprises depositing dopants of first conductivity type on the sidewalls of the trench and then simultaneously diffusing the deposited dopants of first conductivity type and the implanted dopants of second conductivity type into the first body region.

23. The method of claim 19, wherein said second body region forming step comprises the steps of implanting dopants of second conductivity type at the bottom of the trench and then diffusing the implanted dopants of second conductivity type into the first body region.

24. The method of claim 23, wherein said source region forming step follows said second body region forming step and comprises depositing dopants of first conductivity type on the sidewalls of the trench and then simultaneously diffusing the deposited dopants of first conductivity type and the implanted dopants of second conductivity type into the first body region.

25. The method of claim 20, wherein said second body region forming step comprises the steps of implanting dopants of second conductivity type at the bottom of the trench and then diffusing the implanted dopants of second conductivity type into the first body region.

26. The method of claim 25, wherein said source region forming step follows said second body region forming step and comprises depositing dopants of first conductivity type on the sidewalls of the trench and then simultaneously diffusing the deposited dopants of first conductivity type and the implanted dopants of second conductivity type into the first body region.

27. A method of forming a power semiconductor device, comprising the steps of:
   forming a plurality of gate electrodes on a first face of a semiconductor substrate containing a region of first conductivity type therein;
   forming a plurality of trenches having respective bottoms and sidewalls in the region of first conductivity type, by etching the semiconductor substrate using the plurality of gate electrodes as an etching mask;
   forming a plurality of first body regions of second conductivity type in the region of first conductivity type by depositing dopants of second conductivity type into the plurality of trenches and diffusing the deposited dopants of second conductivity type into the region of first conductivity type; and after said step of forming a plurality of trenches:
      forming a second body region of second conductivity type in each of the plurality of first body regions of second conductivity type by implanting dopants of second conductivity type into the bottoms of the plurality of trenches using the gate electrodes as an implant mask and then diffusing the implanted dopants of second conductivity type into the plurality of first body regions so that the second body regions have higher second conductivity type dopant concentrations therein than the plurality of first body regions; and then
      forming at least one source region of first conductivity type in each of the plurality of first body regions of second conductivity type by depositing dopants of first conductivity type onto the sidewalls of the plurality of trenches and then diffusing the deposited dopants of first conductivity type while simultaneously further diffusing the implanted dopants of second conductivity type into the plurality of first body regions so that each of the at least one source regions forms a rectifying junction with a respective first body region and a rectifying junction with a respective second body region.

28. The method of claim 27, further comprising the step of forming a first electrode extending on the gate electrodes and into each of the plurality of trenches to thereby ohmically contact the plurality of source regions and the plurality of second body regions.

29. The method of claim 28, further comprising the step of forming a second electrode extending adjacent a second face of the semiconductor substrate, opposite the first face, to thereby define a vertical power semiconductor device.

30. The method of claim 28, further comprising the step of forming a second electrode extending adjacent the first face of the semiconductor substrate and in ohmic contact with a region therein, to thereby define a lateral power semiconductor device.

31. A method of forming a power semiconductor device, comprising the steps of:
   forming a plurality of gate electrodes on a first face of a semiconductor substrate containing a region of first conductivity type therein;
   forming a plurality of first body regions of second conductivity type in the region of first conductivity type by implanting dopants of second conductivity type into the first face of the semiconductor substrate using the plurality of gate electrodes as an implant mask and then diffusing the implanted dopants of second conductivity type into the region of first conductivity type;
   etching the plurality of first body regions using the gate electrodes as an etching mask to thereby define a plurality of trenches having respective bottoms and sidewalls; and then after said etching step:
      forming a second body region of second conductivity type in each of the plurality of first body regions of second conductivity type by implanting dopants of second conductivity type into the bottoms of the plurality of trenches using the gate electrodes as an implant mask and diffusing the implanted dopants of second conductivity type into the plurality of first body regions so that the second body regions have higher second conductivity type dopant concentrations therein than the plurality of first body regions; and then
      forming at least one source region of first conductivity type in each of the plurality of first body regions of second conductivity type by depositing dopants of first conductivity type onto the sidewalls of the plurality of trenches and then diffusing the deposited dopants of first conductivity type while simultaneously further diffusing the implanted dopants of second conductivity type into the plurality of first body regions so that each of the at least one source regions forms a rectifying junction with a respective first body region and a rectifying junction with a respective second body region.

32. The method of claim 31, further comprising the step of forming a first electrode extending on the gate electrodes and into each of the plurality of trenches to thereby ohmically contact the plurality of source regions and the plurality of second body regions.

33. The method of claim 32, further comprising the step of forming a second electrode extending adjacent a second face of the semiconductor substrate, opposite the first face, to thereby define a vertical power semiconductor device.

34. The method of claim 32, further comprising the step of forming a second electrode extending adjacent the first face of the semiconductor substrate and in ohmic contact with a region therein, to thereby define a lateral power semiconductor device.

35. A method of forming an insulated-gate field effect transistor, comprising the steps of:
   forming a gate electrode on a face of a semiconductor substrate containing a region of first conductivity type therein extending to the face;
   etching the semiconductor substrate to define a trench therein which is self-aligned to the gate electrode, using the gate electrode as an etching mask;

forming a first body region of second conductivity type which is self-aligned to the gate electrode, in the region of first conductivity type; and after said step of etching the semiconductor substrate:

diffusing second body region dopants of second conductivity type from adjacent a bottom of the trench into the first body region to define a second body region therein which has a higher second conductivity type dopant concentration therein than the first body region; and then diffusing source region dopants of first conductivity type from adjacent a sidewall of the trench into the first and second body regions, to define a source region which forms first and second P-N junctions with the first and second body regions, respectively, and extends opposite the gate electrode.

36. The method of claim 35, wherein said step of diffusing second body region dopants is preceded by the step of implanting the second body region dopants into the bottom of the trench, using the gate electrode as an implant mask.

* * * * *